United States Patent
Terada et al.

(10) Patent No.: US 6,917,231 B2
(45) Date of Patent: Jul. 12, 2005

(54) PULSE WIDTH MODULATION CIRCUIT AND ILLUMINATING DEVICE INCORPORATING SAME

(75) Inventors: Ryu Terada, Iwata-gun (JP); Shunsuke Kamimura, Iwata-gun (JP); Shinichi Suzuki, Iwata-gun (JP)

(73) Assignee: Minebea Co., Ltd., Miyota-machi (JP)

( * ) Notice: Subject to any disclaimer, the term of this patent is extended or adjusted under 35 U.S.C. 154(b) by 0 days.

(21) Appl. No.: 10/463,544

(22) Filed: Jun. 18, 2003

(65) Prior Publication Data

US 2004/0021492 A1 Feb. 5, 2004

(30) Foreign Application Priority Data

Jul. 30, 2002 (JP) ........................................ 2002-221540

(51) Int. Cl.[7] .............................................. H03K 3/017
(52) U.S. Cl. ........................ 327/175; 327/172; 327/118
(58) Field of Search ................................ 315/246, 194, 315/209 R, 291, 307, DIG. 5; 327/175, 172, 118, 113

(56) References Cited

U.S. PATENT DOCUMENTS

| | | | |
|---|---|---|---|
| 3,949,322 A | | 4/1976 | Morita .................... 331/113 R |
| 5,612,597 A | * | 3/1997 | Wood .......................... 315/293 |
| 5,925,985 A | | 7/1999 | Zeng et al. .................. 315/224 |

OTHER PUBLICATIONS

"Variable–Frequency, Variable Pulse–Width Generator," Electronics World and Wireless World, Reed Business Publishing, Sutton, Surrey, GB, vol. 104, pp. 923, Nov. 1998.

\* cited by examiner

*Primary Examiner*—Tuyet Thi Vo
(74) *Attorney, Agent, or Firm*—Oliff & Berridge, PLC

(57) ABSTRACT

In a pulse width modulation circuit, which generates an output whose pulse width is modulated by controlling a duty ratio of an oscillation circuit adapted to generate an oscillation at a frequency determined by a resistor and a capacitor to be electrically charged via the resistor, there is provided a resistance value varying means to vary a value of the resistor. The value of the resistor is varied by shorting the both ends of the resistor with a transistor, whereby the capacitor is charged in a reduced amount of time realizing a high-speed pulse width modulation circuit.

1 Claim, 5 Drawing Sheets

PULSE WIDTH MODULATION CIRCUIT AND ILLUMINATING DEVICE INCORPORATING SAME

BACKGROUND OF THE INVENTION

1. Field of the Invention

The present invention relates to a pulse width modulation circuit, and more particularly to a pulse width modulation circuit composed of a general-purpose pulse width modulation circuit and adapted to operate at a high speed, and also an illuminating device using the circuit.

2. Description of the Related Art

A pulse width modulation circuit is used in various devices, and is commercially available as a general-purpose LSI (Large Scale Integration) recently. The specification of such a pulse width modulation circuit is determined for versatile applications. For example, referring to FIG. 5 showing a circuit block diagram, an LSI "FA13842 (Product Name)" 1 for a pulse width modulation circuit comprises a self-excited oscillator 3 which oscillates at a constant frequency determined by a resistor RT connected between terminals ⑧ and ④ of the LSI1 and by a capacitor CT having its one end connected to the terminal ④ and the other end grounded, and the LSI 1 charges the capacitor CT by 5 V REF of the terminal ⑧ via the resistor RT.

A circuit including two UVLOs (Undervoltage Lockout circuit) in the LSI 1 is adapted to check $V_{CC}$ $V_{REF}$ before an output stage (OUT terminal) starts operation. The circuit is not directly related to a pulse width modulation circuit which is the main subject of the present invention, so its operation is not described here. In FIG. 5, a MOS FET to drive current to an inductance is shown as an example of load, and an output terminal ⑥ of the LSI 1 is connected to a gate of the MOS FET. And a resistor RS adapted to detect current has its one end connected to a source of the MOS FET and has its other end grounded. For ease of understanding, the pulse width modulation circuit will be described with reference to FIGS. 6 and 7A. FIG. 6 is a diagram of a conventional circuit to perform a pulse width modulation by using the LSI 1, and FIG. 7A is a time chart for explaining the operation. The LSI 1 comprises the aforementioned self-excited oscillator 3, an error amplifier 2, and a differential amplifier 4 as shown in FIG. 5, and is adapted to output a rectangular wave signal OUT with modulated pulse width as shown in FIG. 7A at an OUTPUT terminal ⑥ according to a luminance signal (not shown) inputted from an outside source to the self-excited oscillator 3.

Referring to FIG. 6, the self-excited oscillator 3 oscillates at a constant frequency determined by the resistor RT and the capacitor CT. Specifically, in the LSI 1 (FA13842), the capacitor CT is charged up to about 3 V by DC 5 V from the VREF at the terminal ⑧ via the resistor RT, and is discharged down to about 1.4 V by a discharging circuit in the self-excited oscillator 3. When the self-excited oscillator 3 is charged up to about 3 V, its output is boosted up to a high level, and the electrical charge stored in the capacitor CT is dissipated to go down to about 1.4 V by the discharging circuit of a resistor RT2 in the self-excited oscillator 3 thereby reducing the output of the self-excited oscillator 3 to a low level, which results in the self-excited oscillator 3 outputting a pulse signal SET shown in FIG. 7A.

The pulse signal SET thus generated is inputted to a set terminal of a flip-flop 5, and the flip-flop 5 is set by the falling edge of the pulse signal SET thereby increasing the signal OUT at the OUTPUT terminal ⑥ up to a high level. When the signal OUT is outputted, the MOS FET shown in the figure turns on, and a current is caused to flow in an inductance of a load. The current generates a voltage at a resistor RS adapted to detect a current, and the voltage generated is inputted to a terminal ③ as a detecting signal ISENS corresponding to the current. The signal ISENS has a same current waveform as produced when a rectangular waveform voltage is applied to the inductance and therefore generates a sawtooth voltage as shown in FIG. 7A. The signal ISENS is inputted to one input terminal ③ of a comparator 4 and is compared with a signal COMP inputted to the other input terminal ① of the comparator 4. If the comparator 4 determines that the signal ISENS surpasses the signal COMP, the comparator 4 outputs a signal RESET at its output terminal, which resets the flip-flop 5 reducing the signal OUT at the output terminal ⑥ to a low level. The signal COMP is a reference voltage to control the current flowing in the load at a predetermined value, specifically, when the load is a Xe lamp, is a luminance signal to apply a current to flow in the Xe lamp from outside to a COMP terminal ① of the LSI 1 in order to achieve a prescribed luminance. FIG. 7A shows the voltage of the signal COMP increases gradually. This is to indicate that the pulse width of the signal OUT varies according to the change of the voltage, that is to say a pulse width modulation is performed. When the voltage of the signal COMP increases, the pulse width of the signal OUT is increased thereby increasing a duty ratio. In other words, the current flowing in the Xe lamp increases, and thereby the luminance is enhanced. And the gradual increase of the signal COMP shown in FIG. 7 also indicates an example of a method to slow start lighting the Xe lamp, namely a starting method to gradually increase the luminance of the Xe lamp. In the slow start method, a signal COMP is applied as shown in FIG. 7A, whereby the current supplied to the Xe lamp is gradually increased so as to gradually enhance the luminance of the Xe lamp.

In the above described operation, the pulse signal SET, that is the output of the oscillator 3, stays at a low level for a time period until the capacitor is charged up to about 3 V. The charge voltage of the capacitor CT increases at a time constant determined by the resistor RT and the capacitor CT. In other words, the upper limit of the oscillation frequency of the self-excited oscillator 3 is determined by the resistor RT and the capacitor CT, and in the conventional circuit shown in FIG. 6 the oscillation frequency does not exceed the limit.

A discharge lamp (e.g., cold-cathode fluorescent lamp) has been increasingly used as a light source for a scanner in accordance with the spread of color photocopiers. In using the discharge lamp, it is demanded that the luminance be modulated to be optimized in consideration of the variance in the luminance of lamps and in the sensitivity of sensors, and the kind of manuscripts to be scanned. Conventionally, this luminance modulation has been generally performed by controlling the exposure time of a sensor, or by changing the lamp current as above described. For example, in the discharge lamp lighting device to light a cold-cathode fluorescent lamp (referred to also as "backlight inverter device"), the cold-cathode fluorescent lamp is lighted by an AC voltage and has its luminance modulated by changing the tube current. The tube current flowing in the cold-cathode fluorescent lamp is uninterrupted and is controlled to stay at a predetermined level, and the luminance of the cold-cathode fluorescent lamp can be modulated somewhere from 50% up to 100% maximum. This modulation method is generally called "current modulation method".

As above described, the light source for a scanner is desired to be capable of having its luminance or illuminance modulated continuously and smoothly. In this regard, the method to control the tube current of the cold-cathode fluorescent lamp is convenient. The cold-cathode fluorescent lamp, however, has emission characteristics different from those of an incandescent lamp, and is not suitable for a color scanner. Also, it is difficult for the fluorescent lamp to achieve an enhanced luminance. Furthermore, in order to expand the area of a lower luminance side to thereby expand the modulation range, the tube current in the fluorescent lamp must be decreased. However, since a decrease in the tube current inherently leads to an unstable electrical discharge, the lower luminance side has its lowest luminance limited to about 50% of the maximum luminance in the continuous constant current control method above described, and also the relation between the tube current and the luminance is not linear thereby making the control difficult. Moreover, the cold-cathode fluorescent lamp has variance in its characteristics, making it difficult to achieve the optimum tube current.

And, when the aforementioned LSI "FA13842 (Product Name)" is used for a pulse width modulation circuit in order to light the discharge lamp at a high frequency, there is a problem that the LSI has an upper limit in oscillation frequency and may not appropriately work depending on the kind of a discharge lamp to be lighted. Conventionally, the oscillation frequency of the LSI has been increased by such a method that a transistor TRI is connected to both ends of the capacitor CT via a resistor r1 at one end as shown in FIG. 6, and a PCT1 synchronized is applied to a base of the transistor TR1 when the transistor TR1 is discharged thereby reducing the discharge time. In this connection, the resistor r1, which is a protective resistor to prevent a current exceeding a carrying capacity from flowing in the transistor TR1, may be omitted. However, there is a limitation to the increase in the oscillation frequency.

SUMMARY OF THE INVENTION

The present invention has been made in the light of the above problems, and it is an object of the present invention to provide a pulse width modulation circuit which operates at a high speed, and to provide an illuminating device incorporating the circuit.

In order to achieve the above object, according to a first aspect of the present invention, in a pulse width modulation circuit which generates an output whose pulse width is modulated by controlling a duty ratio of an oscillation circuit adapted to generate an oscillation at a frequency determined by a resistor and a capacitor to be electrically charged via the resistor, there is provided a resistance value varying means which varies a value of the resistor to determine the frequency of the oscillation generated by the oscillation circuit. With the provision of the resistance value varying means above described, a high-speed pulse width modulation circuit can be obtained using a pulse width modulation circuit commercially available on the market, which enables a decrease in cost and an increase in speed.

According to a second aspect of the present invention, in the pulse width modulation circuit of the first aspect, the resistance value varying means is a switching circuit adapted to short both ends of the resistor.

According to a third aspect of the present invention, an illuminating device comprises: a pulse width modulation circuit, in which a duty ratio of an oscillation circuit is varied by varying a value of a resistor, which, in combination with a capacitor to be charged with electricity via the resistor, determines a frequency of an oscillation generated by the oscillation circuit; and a rare-gas discharge lamp, which is driven by an output signal of the pulse width modulation circuit and has its luminance varied depending on a lighting frequency of the pulse width modulation circuit. With the illuminating device above structured, the rare-gas discharge lamp can be lighted at a high frequency, which enables reduction in device size and control of the luminance of the rare-gas discharge lamp, and which, as a result, contributes greatly to an increase in speed and a decrease in cost of a color scanner, and the like.

DETAILED DESCRIPTION OF THE PREFERRED EMBODIMENTS

The present inventors focused on a scanner using a rare-gas discharge lamp as a light source, such as a Xe lamp, which is highly luminant and contains a lot of incandescent light components, and also noted that the rare-gas discharge lamp such as the Xe lamp, which is generally lighted by a DC current, has its luminance varied depending on a lighting frequency of the Xe lamp and that the luminance is related comparatively linearly to the lighting frequency. From this, in an embodiment described below, frequency-dependent characteristics of the Xe lamp were obtained in the first place, then a pulse width modulation circuit comprising a general-purpose LSI was used as a lighting circuit adaptable to the characteristics, and a means capable of controlling its duty ratio to the lighting frequency of the Xe lamp was provided, whereby a pulse width modulation circuit was obtained, which uses a general-purpose LSI and can perform high-frequency operation. Thus, an illuminating device was invented, which uses such a pulse width modulation circuit as a pulse width modulation circuit to vary the luminance of the Xe lamp.

Figure 5:
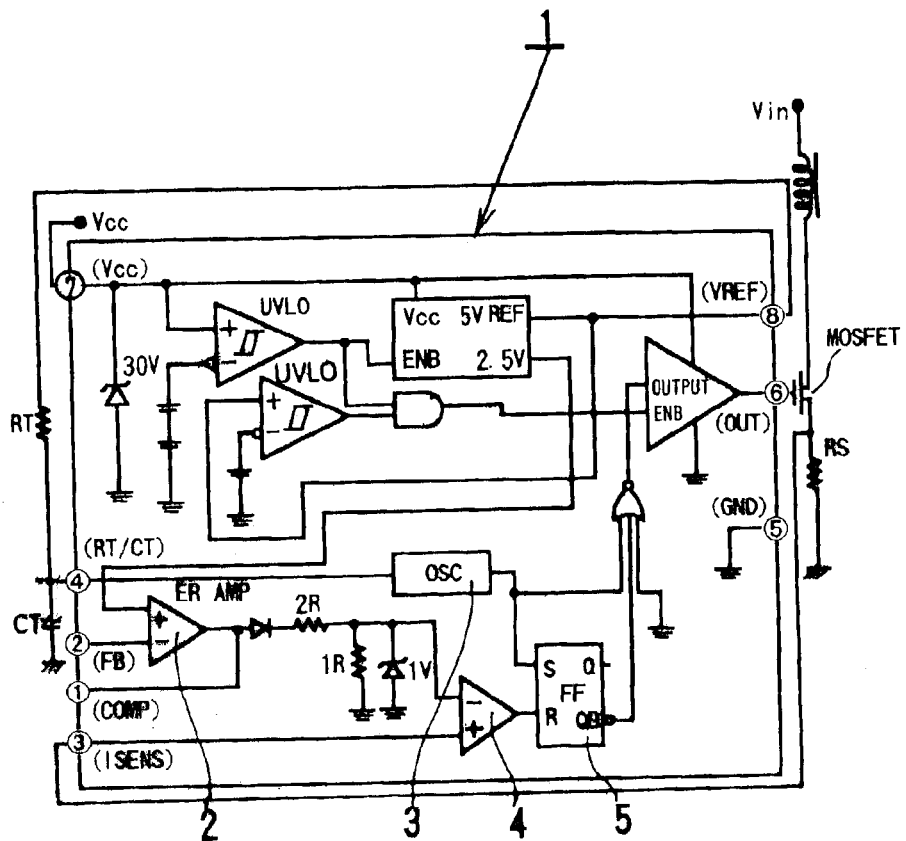
FIG. 5 is a block diagram of a circuit of a conventional LSI for a pulse width modulation circuit.
Figure 6:
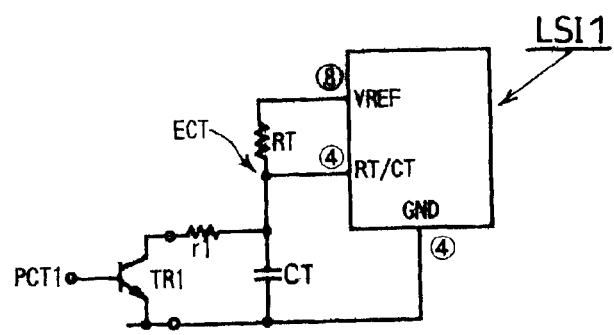
FIG. 6 is a block diagram of a circuit for modulating a pulse width by using the conventional LSI for a pulse width modulation circuit.

One embodiment of the present invention will be described with reference to FIGS. 1 to 4, 7A and 7B. An LSI designated as "1" in FIG. 1 for a pulse width modulation circuit is the same as the LSI shown in FIGS. 5 and 6.

Figure 2:
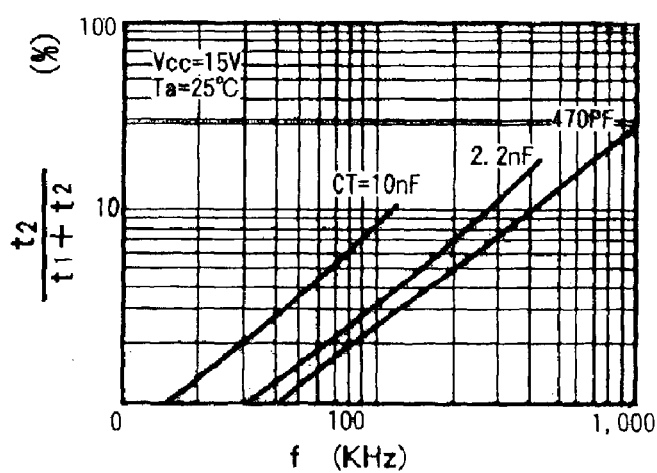
FIG. 2 is a chart of oscillation characteristics of an LSI "FA13842 (Product Name)
Figure 7A:
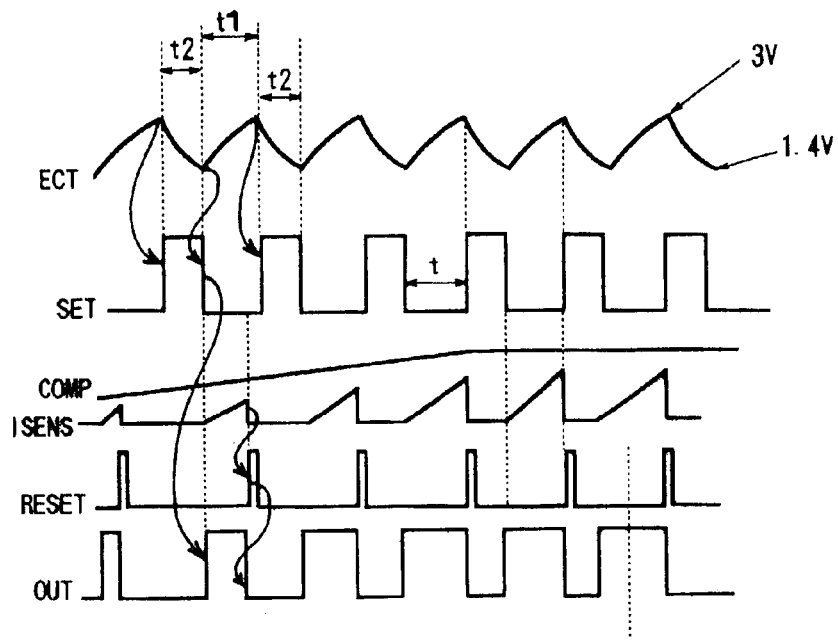
FIG. 7A is a time chart of an operation by the conventional circuit.

First, the oscillation characteristics of the LSI 1 "A13841 (Product Name)" will be discussed with reference to FIG. 2, in which the oscillation frequency f is indicated on the abscissa, and the duty ratio [t2/(t1+t2)] (where t1 corresponds practically to a rising time, and t2 is a falling time)

of the voltage ECT (see FIG. 7A) is indicated on the ordinate, and in which it is shown how the duty ratio varies depending on the capacitor CT. As shown in FIG. 2, the duty ratio varies depending on the capacitor CT and its upper limit does not exceed 30%. Also, FIG. 7A shows that a small duty ratio indicates that the rising time t1 is long and the falling time t2 is short. That is, it was noted that the upper limit of the oscillation frequency of the self-excited oscillator 3 is determined by the resistor RT and the capacitor CT, and also is restricted by the rising time t1 of the voltage ECT.

With focus placed on the above mentioned fact that the upper limit of the oscillation frequency of the self-excited oscillator 3 is determined by the resistor RT and the capacitor CT, and also is restricted by the rising time t1 of the voltage ECT, the rising time t1 of the voltage ECT is set short to be precipitous. In order to reduce a charge time, a resistance value varying means for varying the value of the resistor RT is provided, specifically a series circuit which consists of a transistor TR2 and a resistor r2 and which constitutes the resistance value varying means is connected to both ends of the resistor RT thereby forming a switching circuit, in which the transistor TR2 is turned on and off to short the resistor RT making the voltage ECT rise sharply.

Figure 1:
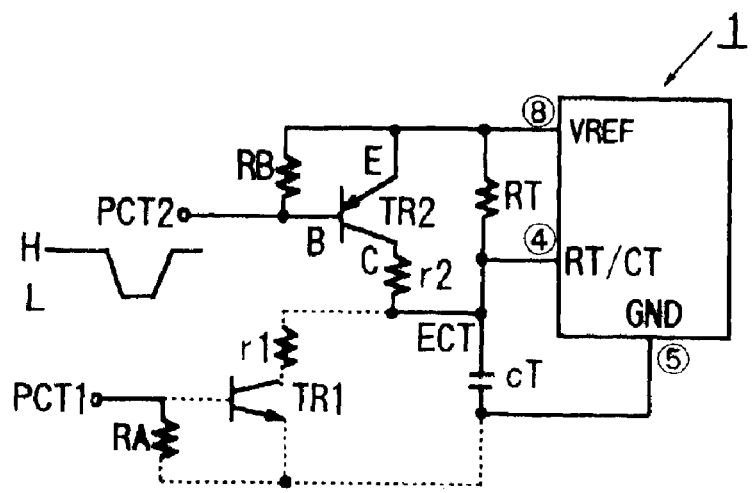
FIG. 1 is a block diagram of a pulse width modulation circuit according to an embodiment of the present embodiment.
Figure 7B:
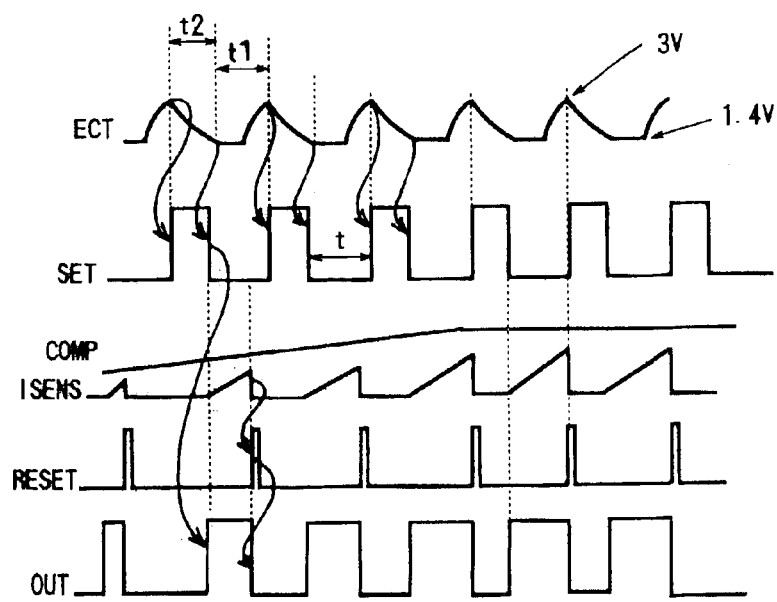
FIG. 7B is a time chart of an operation by the circuit of the present invention.

Referring back to FIG. 1, the transistor TR2 is connected to both ends of the resistor RT such that a resistor RB has its both ends connected respectively to a base terminal B and an emitter terminal E of the transistor TR2, the emitter terminal E is connected to a terminal ⑧ of the LSI 1, and a collector terminal C of the transistor TR2 is connected to a terminal ④ of the LSI 1 via the resistor r2. And the capacitor CT has its both ends connected respectively to the terminal ④ and a terminal ⑤ of the LSI 1. When a pulse signal PCT2 applied to the base terminal B of the transistor TR2 becomes low, the transistor TR2 is turned on thereby shorting the resistor r2. As a result, the voltage ECT at the connection (the terminal ④) between the resistor RT and the capacitor CT, both connected to the self-excited oscillator 3 of the LSI 1, does not rise according to the rising time t1 as shown in FIG. 7A but rises sharply as shown in FIG. 7B according to the waveform of the pulse signal PCT2 applied to the base terminal B of the transistor TR2. FIG. 1 shows a diagram including a quick discharging circuit, namely the method mentioned in the prior art description, by which the time to discharge the capacitor CT is reduced by means of the transistor TR1 and the resistor r1.

The output of the self-excited oscillator 3 becomes high when the voltage ECT is charged up to 3 V, and if the base terminal B of the transistor TR2 regains a high level after the voltage ECT is charged up to 3 V, the transistor TR2 is turned off. The electrical charge stored in the capacitor CT is discharged during the falling time t2 shown in FIG. 7A whereby the voltage ECT is decreased, and when the voltage ECT is reduced to zero, the output of the self-excited oscillator 3 becomes low. As a result, a time t, during which a pulse signal SET shown FIG. 7B, that is the output signal of the self-excited oscillator 3, stays low, depends, according to the pulse signal PCT2, on a time t1 which includes a rising time of the voltage ECT at the terminal ④ of the LSI 1 and on a falling time t2 of the voltage ECT at the terminal ④. So, the time t can be set at a value below the time constant determined by the resistor RT and the capacitor CT, and the rising time can be reduced to form a sharp rise by the pulse signal PCT2 thereby realizing a high-speed pulse width modulation circuit.

Figure 3:
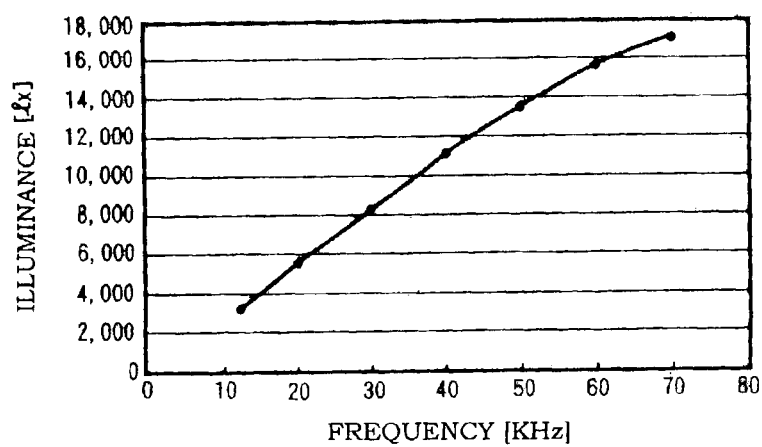
FIG. 3 is a plot of frequency-dependent characteristics of a Xe lamp.

Referring to FIG. 3, the ordinate represents the luminance of the Xe lamp, and the abscissa represents the lighting frequency, showing how the illuminance varies depending on the lighting frequency. As shown in FIG. 3, the illuminance varies linearly and satisfactorily from 12 to 60 kHz increasing about four times therebetween. Thus, an illuminating device is achieved, which employs: a rare-gas discharge lamp (Xe lamp) whose luminance varies depending on the lighting frequency; and a lighting circuit which drives the rare-gas discharge lamp by the signal outputted from the pulse width modulation circuit.

Figure 4:
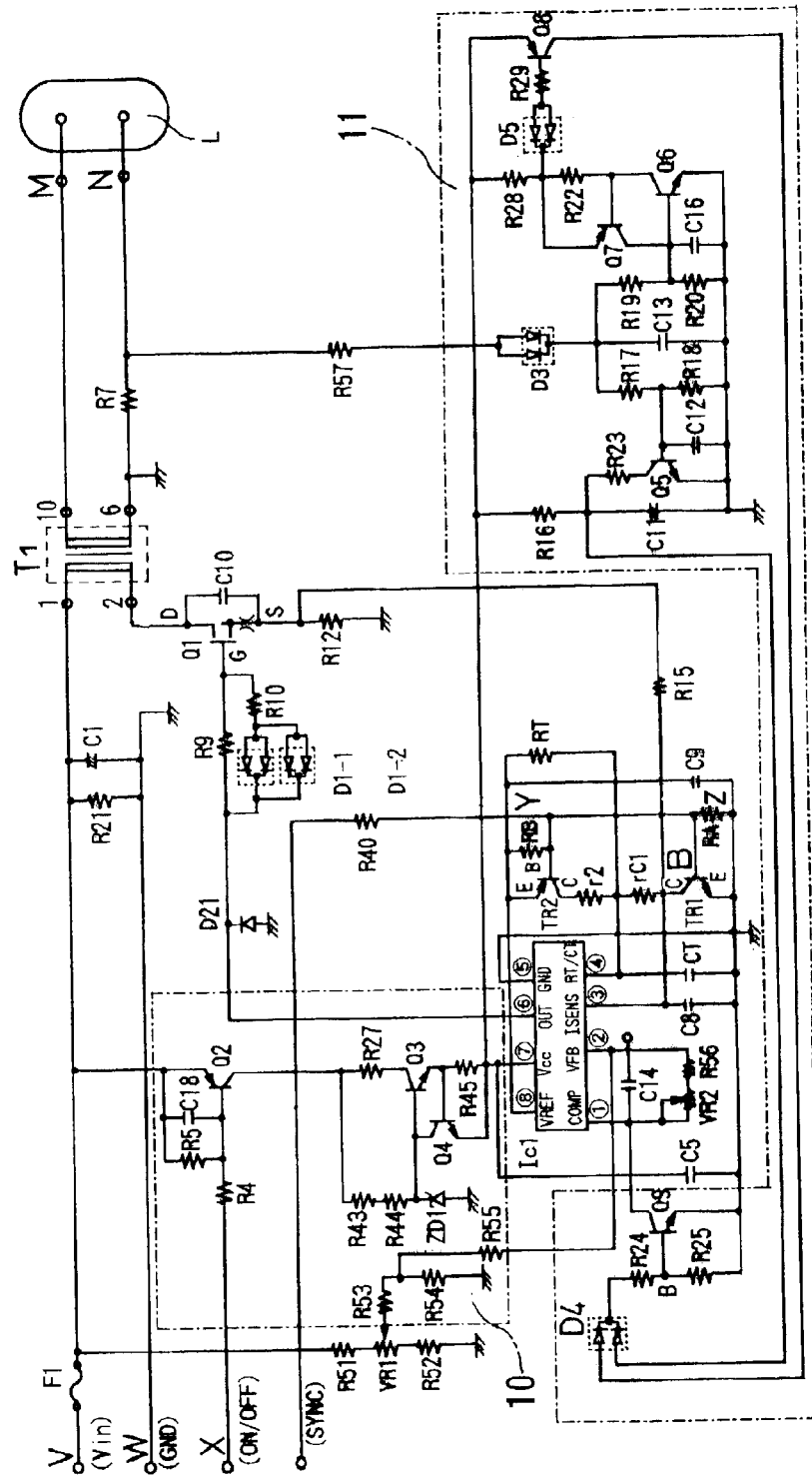
FIG. 4 is a block diagram of a circuit for an illuminating device according to the embodiment of the present invention.

A circuit of the illuminating device above described will be discussed with reference to FIG. 4. The illuminating device, as above described, comprises: a lighting circuit which drives a rare-gas discharge lamp by the signal whose pulse width is modulated by varying the duty ratio of the output signal of the oscillator by varying the resistance value of the resistor RT to determine the oscillation frequency; and a rare-gas discharge lamp whose luminance varies depending on the lighting frequency of the lighting circuit. In FIG. 4, the rare-gas discharge lamp is a Xe lamp L which has the characteristics shown in FIG. 3, and the pulse width modulation circuit uses the LSI shown in FIG. 5 (explanation thereof omitted).

Input terminals V, W and X are, respectively, a DC voltage terminal, a grounding terminal, and a signal terminal for a signal enabling the pulse width modulation circuit LSI (IC1), and a terminal Y is a signal terminal for varying the value of the resistor RT to determine the oscillation frequency. The Xe lamp L has its terminal M connected to an output terminal 10 of a transformer T1 and has its terminal N connected to an output terminal 6 of the transformer T1 via an abnormality detecting resistor R7. The transformer T1 has its input terminal 1 connected to the DC voltage terminal W and has its input terminal 2 connected to a drain terminal D of an FET (Q1), and the FET (Q1) has its source terminal S grounded via a resistor R12 for detecting current and has its gate terminal G connected to an output of the pulse width modulation circuit LSI (IC1).

A voltage VCC is applied to a terminal ⑦ of the pulse width modulation circuit LSI (IC1) from the DC voltage terminal V via a stabilized power supply 10. The stabilized power supply 10 includes a switching circuit formed by a transistor Q2 which is turned on and off according to a signal sent from the signal terminal X and enabling the LSI (IC1). The abnormality detecting resistor R7 is connected to an abnormality detecting circuit 11 via a resistor R57 and a diode D3. The abnormality detecting circuit 11 detects the open circuit of the Xe lamp L by a transistor Q5 and detects the short circuit of the Xe lamp L by transistors Q6, Q7 and Q8. The theoretical sum of the both detection results is gained by a diode D4 which is connected to a base terminal B of a transistor Q9.

The resistor RT described in FIG. 1 has its terminals connected respectively to the terminals ⑧ and ④, and the capacitor CT has its one terminal connected to the terminal ④ and the other terminal grounded. The resistor RB is connected to the base terminal B and the emitter terminal E of the transistor TR2. The resistor RT has its ends connected respectively to the emitter terminal E of the transistor TR2 and one terminal of a resistor r2 which has its other terminal connected in series to the collector terminal C of the transistor TR2, and the emitter terminal E is connected to the aforementioned terminal ⑧ (VREF terminal) of the IC1. The capacitor CT has its ends connected respectively to an emitter terminal E of the transistor TR1 and one terminal of a resistor r1 which has its other terminal connected in series to a collector terminal C of the transistor TR1. A resistor RA has it ends connected respectively to a base terminal B (input terminal Z) of the transistor TR1 and a grounded end of the capacitor CT. The input terminal Z is for a pulse signal PCT1 to control the aforementioned discharge time. The base terminal B of the transistor TR1 is connected to the input terminal Y via the input terminal Z, while the base terminal of the transistor TR2 is connected to an external circuit via a resistor R40. The external circuit outputs the signals PCT2 and PCT 1 which are shown in FIG. 1 and which varies the value of the resistor RT to determine the oscillation frequency. The external circuit may be, for example, a frequency converter (not shown) which detects the illuminance or luminance of the Xe lamp L and generates a signal with a frequency proportional to the illuminance or luminance detected. A voltage generated at a resistor R12 which has its one end connected to a source terminal S of an FET (Q1) and has its other end grounded and which is adapted to detect current, is applied to an ISENS terminal (terminal ③) of the LSI (IC1) via a resistor R15. Since the ISENS terminal ③ is connected to one end of a capacitor C8 having its other end grounded, the voltage generated at the resistor R12 for detecting current is converted into a sawtooth voltage by an integration circuit composed of the resistor R1 and the capacitor C8, and is inputted to the ISENS terminal ③ of the LSI (IC1). A luminance setting signal which is a voltage at the input terminal (see FIG. 4) divided by a variable resistor VR and which is for setting luminance at a predetermined value is inputted to a VFB terminal (terminal ②) of the LSI (IC1).

The operation by the above structure is described with reference to the time chart shown in FIG. 7B. When a signal to enable the pulse width modulation circuit LSI (IC1) is inputted at the input terminal Y, the transistor Q2 is turned on, which activates the pulse width modulation circuit LSI (IC1) thereby generating the signal OUT with a predetermined cycle at an output terminal ⑥ of the pulse width modulation circuit LSI (IC1). As a result, if the Xe lamp L is not turned on normally, the abnormality detecting circuit 11 detects the open or short circuit and causes a terminal ① of the pulse width modulation circuit LSI (IC1) to be shorted with the transistor Q9 so that the operation of the pulse width modulation circuit LSI (IC1) is stopped thereby turning off the FET (Q1). And, if the Xe lamp is turned on normally, a tube current is caused to flow and a voltage proportional to the tube current is generated at the ends of the resistor R12. The voltage thus generated is converted into a sawtooth voltage by the integration circuit composed of the resistor R15 and the capacitor C8 and is inputted to the ISENS terminal ③, as described above. And, the luminance setting signal is inputted to the VFB terminal ②, and is compared with a reference voltage and amplified by ER AMP2 of the LSI (IC1), and its output is compared by a comparator 4 of the LSI (IC1) with the sawtooth voltage converted from a voltage in proportion to the tube current.

When the Xe lamp L is turned on normally, a pulse signal PCT with a cycle proportional to the luminance or illuminance of the Xe lamp L is generated by a frequency converter (not shown) and is supplied as the pulse signals PCT1 and PCT2 (see FIG. 1) to respective base terminals B and B of the transistors TR1 and TR2. The transistors TR1 and TR2 are turned on and off according to the pulse signal PCT thereby forming the voltage ECT shown in FIG. 7B. Specifically, when the pulse signal PCT is raised to a high level, the transistor TR2 is turned off and at the same time the transistor TR1 is turned on, thereby forming a voltage having a waveform defined by a sharp rise and a relatively moderate fall like the voltage ECT shown in FIG. 7B. When the pulse signal PCT reaches a high level, the transistor TR2 is turned off, then the voltage ECT is reduced to zero in the time t2 after the transistor TR2 is turned off. When the voltage ECT reaches zero, a tube current is caused to flow, the signal ISENS increases, and the output OUT of the pulse width modulation circuit LSI (IC1) is increased to a high level. On the other hand, the luminance setting signal is inputted to the terminal ② of the LSI (IC1) and is compared with the sawtooth voltage converted from a voltage in proportion to the tube current detected and which is inputted to the ISENS terminal ③. If the amplitude of the sawtooth voltage inputted to the ISENS terminal ③ outruns the luminance setting signal, a signal RESET is generated to reset the flip-flop 5 of the IC1 thereby decreasing the output OUT of the IC1 to a low level.

The transistor TR2 is turned on and the voltage ECT is charged up to 3 V, then the transistor TR2 is turned off at a cycle generated by the frequency converter. When the voltage ECT is reduced to zero in the time t2 after the transistor TR2 is turned off, the output OUT of the IC1 is increased to a high level and the FET (Q1) is turned on causing a source current to flow and increasing the ISENS signal. With the operation repeated, the FET (Q1) is turned on and off whereby rare-gas discharge lamps are stably lighted with a prescribed luminance by means of a pulse signal which has its pulse width modulated for a duty ratio so as to constitute the luminance setting signal and which is repeated at a high frequency.

What is claimed is:

1. A pulse width modulation circuit comprising:

a resistor;

a capacitor to be electrically charged via the resistor;

an oscillation circuit to generate an oscillation at a frequency determined by the resistor and the capacitor, the oscillation circuit having its duty ratio controlled thereby modulating a pulse width of an output generated by the pulse width modulation circuit; and a resistance value varying means to vary a value of the resistor adapted to determine the frequency of the oscillation generated by the oscillation circuit, wherein the resistance value varying means is a switching circuit which shorts both ends of the resistor.

* * * * *